US006678503B1

United States Patent
Black et al.

(10) Patent No.: US 6,678,503 B1
(45) Date of Patent: Jan. 13, 2004

(54) APPARATUS FOR RADIO FREQUENCY PROCESSING WITH DUAL MODULUS SYNTHESIZER

(75) Inventors: Eric C. Black, Mountain View, CA (US); Richard D. Roberts, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 09/573,782

(22) Filed: May 17, 2000

(51) Int. Cl.[7] .................................................. H04B 1/40
(52) U.S. Cl. .......................................... 455/76; 455/86
(58) Field of Search ............................. 455/76, 78, 86, 455/83–85, 522–523, 180.3, 189.1, 260, 118, 119, 75; 375/219, 221

(56) References Cited

U.S. PATENT DOCUMENTS

| 5,093,636 | A |   | 3/1992  | Higgins, Jr. et al. ......... 332/100 |
|-----------|---|---|---------|---------------------------------------|
| 5,111,162 | A |   | 5/1992  | Hietala et al. ............... 332/127 |
| 5,313,173 | A |   | 5/1994  | Lampe ........................ 332/103 |
| 5,325,075 | A |   | 6/1994  | Rapeli ........................ 332/103 |
| 5,424,688 | A |   | 6/1995  | Phillips ....................... 331/16 |
| 5,483,203 | A | * | 1/1996  | Rottinghaus ................. 331/10 |
| 5,491,457 | A |   | 2/1996  | Feher ......................... 332/103 |
| 5,784,402 | A |   | 7/1998  | Feher ......................... 375/200 |
| 5,802,463 | A |   | 9/1998  | Zuckerman ................. 455/208 |
| 5,828,955 | A |   | 10/1998 | Lipowski et al. ........... 455/324 |
| 5,937,335 | A | * | 8/1999  | Park et al. .................... 455/86 |
| 5,949,281 | A | * | 9/1999  | Sharpe ........................ 329/325 |
| 5,960,364 | A |   | 9/1999  | Dent ........................... 455/552 |
| 6,016,080 | A |   | 1/2000  | Zuta et al. ..................... 331/25 |
| 6,208,875 | B1| * | 3/2001  | Damgaard et al. .......... 455/552 |
| 6,314,279 | B1| * | 11/2001 | Mohindra .................... 455/304 |
| 6,405,022 | B1| * | 6/2002  | Roberts et al. ............... 455/76 |
| 6,421,530 | B1| * | 7/2002  | Adachi et al. ................. 455/86 |

FOREIGN PATENT DOCUMENTS

| EP | 0 541 305 A1 | 10/1992 | ............ H03D/7/16 |
| EP | 0 678 974 A2 | 10/1995 | ............ H03D/7/16 |

* cited by examiner

Primary Examiner—Vivian Chin
Assistant Examiner—Tuan Tran
(74) Attorney, Agent, or Firm—Gary R Stanford

(57) ABSTRACT

An apparatus for radio frequency processing includes a local oscillator synthesizer circuit having a voltage controlled oscillator that generates an oscillator signal f1. A divide-by-N circuit receives the oscillator circuit f1 and divides that signal to produce an f1/N oscillator signal. A dual modulus synthesizer is connected to the divide-by-N circuit and generates a quadrature modulus signal f1/N. A receiver circuit and a transmitter circuit are operatively connected to the local oscillator synthesizer circuit. Each of the receiver circuits and transmitter circuits has at least two mixer circuits for mixing and respectively down converting/up converting intermediate radio frequency signals. The local oscillator synthesizer provides local oscillation for each of the mixer circuits.

17 Claims, 3 Drawing Sheets

APPARATUS FOR RADIO FREQUENCY PROCESSING WITH DUAL MODULUS SYNTHESIZER

FIELD OF THE INVENTION

This invention relates to radio frequency processing, and more particularly, this invention relates to radio frequency processing with phase lock looped circuits.

BACKGROUND OF THE INVENTION

The use of wireless conductivity devices are becoming more commonplace in industry. For example, cellular networks are prevalent throughout the world. Also, wireless local area networks are becoming increasingly popular in certain areas. Many of these wireless applications use frequencies that exist within the frequency bands that do not require a site license from the Federal Communications Commission. An example of such a band exists at around 2.4 GHz, a licensed application space established by the FCC.

One wireless application space is a wireless cable replacement. For example, a wireless cable replacement would allow a computer keyboard to connect to a computer without the use of physical wires. It would be similar to an infrared application, but instead use radio frequencies, instead of light.

However, it is difficult to operate at the higher GHz frequencies using small monolithic circuits. The higher frequencies typically require separate chips and circuits. It would be desirable if a majority of a transceiver radio frequency processor could be incorporated monolithically and a simple design could be implemented that would allow a smaller number of components. This would be beneficial in the processing of intermediate frequencies that would be processed in such a system.

SUMMARY OF THE INVENTION

An apparatus for radio frequency processing includes a local oscillator synthesizer circuit having a voltage controlled oscillator that generates an oscillator signal f1. A divide-by-N circuit receives the oscillator circuit f1 and divides that signal to produce an f1/N oscillator signal. A dual modulus synthesizer is connected to the divide-by-N circuit and generates a quadrature modulus signal f1/N. A receiver circuit and a transmitter circuit are operatively connected to the local oscillator synthesizer circuit. Each of the receiver circuits and transmitter circuits has at least two mixer circuits for mixing and respectively down converting/up converting intermediate radio frequency signals. The local oscillator synthesizer provides local oscillation for each of the mixer circuits.

In still another aspect of the present invention, the receiver circuit includes a first mixer that receives the oscillator signal f1. The receiver circuit also includes a second quadrature function image reject mixer circuit that receives the f1/N oscillator signal and the quadrature modulus signal f1/N. A heterodyne mixer circuit receives the f1/N oscillator signal. The receiver circuit also includes a mixer that receives the oscillator signal from the local oscillator synthesizer.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The apparatus of the present invention forms a radio frequency processor and is used in a radio frequency transceiver. It generates a frequency hopping spread spectrum (FHSS) GFSK, frequency shift keyed, modulated signal in the 2.4 GHz ISM band, and receives and demodulates a frequency hopping spread spectrum GFSK modulated signal within the same 2.4 GHz ISM band. In one advantageous aspect of the present invention, the frequency hopping local oscillator is common to two respective mixing circuits of each of the transmitter and receiver circuits. Most of the transmitter and receiver components are monolithically formed on one chip, including major portions of the transmitter modulator and receiver demodulator circuits. One off-chip voltage controlled oscillator (VCO) has dual conversion, where first and second linear oscillators are harmonically related by a factor "N". Additional voltage controlled oscillators are used to form respective first and second intermediate frequencies (f2 and f3), but these voltage controlled oscillators operate in a frequency range that can be implemented at lower frequencies with on-chip techniques and are less complex.

In the transmitter circuit, frequency translation occurs between the second intermediate frequency (f3) and the first intermediate frequency (f2), as opposed to frequency multiplication, which prevents excessive phase noise amplification. An additional constraint in the receiver is a requirement to provide a low enough first intermediate frequency (f2) that requires image reject mixing techniques to be feasible. Although many aspects of dual conversion are known to those skilled in the art, the system approach to modulation and demodulation of the frequency shift keyed (FSK) signal has several desirable features, including an off-chip frequency hopping VCO that is used for both the transmitter and receiver circuits and facilitates a dual conversion process. It also provides a reference signal for both first and second frequency conversions. A transmitter frequency translation, i.e., up conversion occurs from a second intermediate frequency (f3) to a first intermediate frequency (f2) to prevent phase noise multiplication associated with frequency multiplication. The first intermediate frequency (f2) is low enough to reduce complexity. Receiver image reject mixer techniques from the first intermediate frequency (f2) to the down converted second intermediate frequency (f3) circumvent second intermediate frequency image responses.

The second intermediate frequency (f3) is also low enough to facilitate accurate FSK/GFSK four-level modulation and demodulation with the same phase locked loop (PLL). The first intermediate frequency (f2) is also high enough to afford good first intermediate frequency image rejection in both the receiver and transmitter for simple radio frequency prefiltering, while still allowing the advantages as described above.

Figure 1:
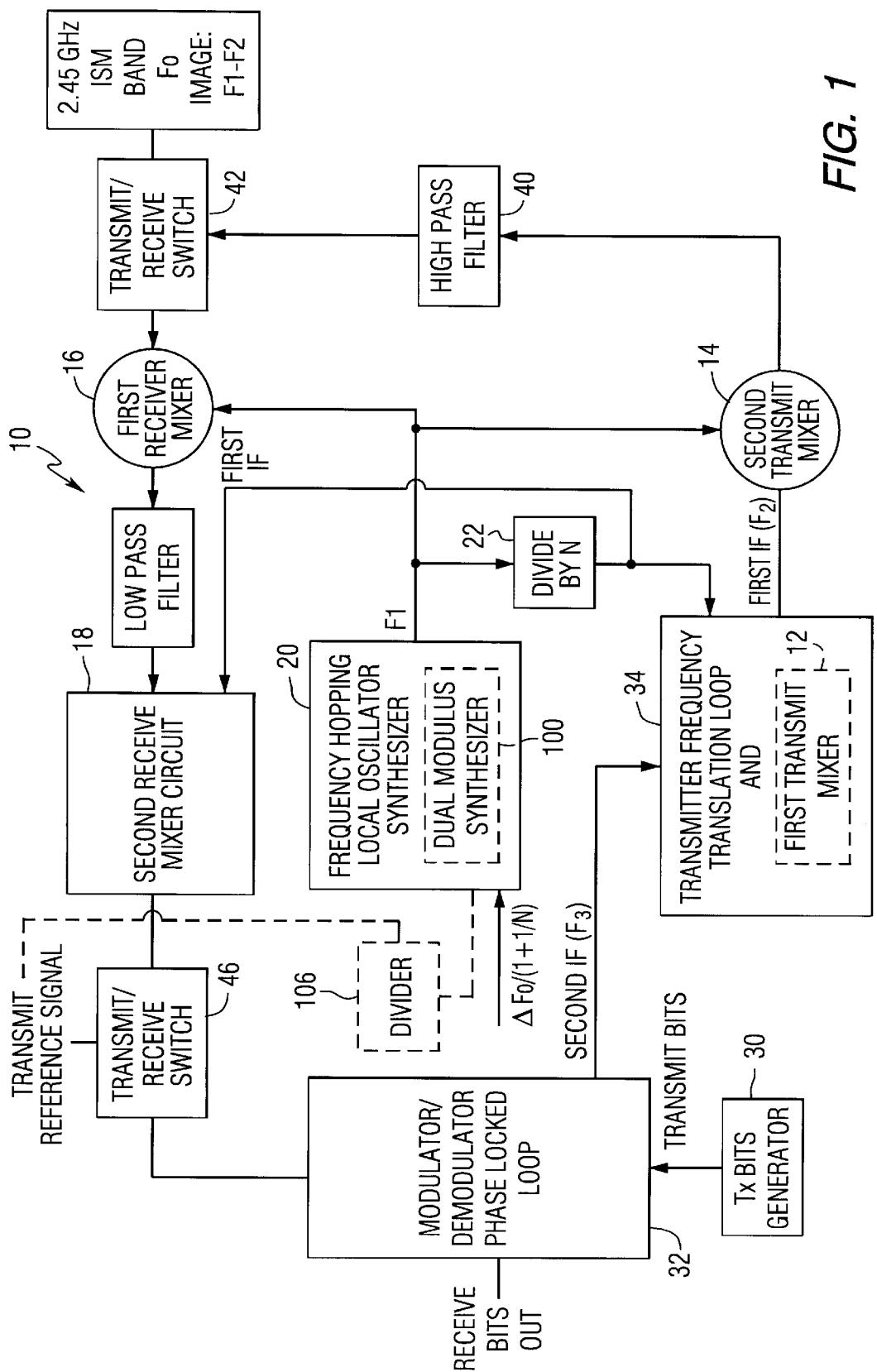
FIG. 1 is a high level block diagram showing basic components of the apparatus of the present invention formed as a radio frequency processor.

Referring now to FIG. 1, there is illustrated a basic block diagram showing high level components of a radio frequency processor 10 used in a communication transceiver for the 2.45 GHz ISM band. Although the described frequencies will be chosen for final operation at the 2.45 GHz ISM band, the described frequencies are only representative of one type of selection of final frequencies at which the radio frequency processor of the present invention can be used. However, the description as follows is pertinent to the higher 2.45 GHz frequency area in the ISM band as described.

In the present invention, there are two transmit mixers, referred to as a first transmit mixer 12 and second transmit mixer 14, and a first receive mixer 16 and second receive image reject mixer circuit 18, which in prior art techniques, would require two local oscillators, one local oscillator for a first transmit and receive mixer, and a second local oscillator for a second transmit and receive mixer.

Figure 2:
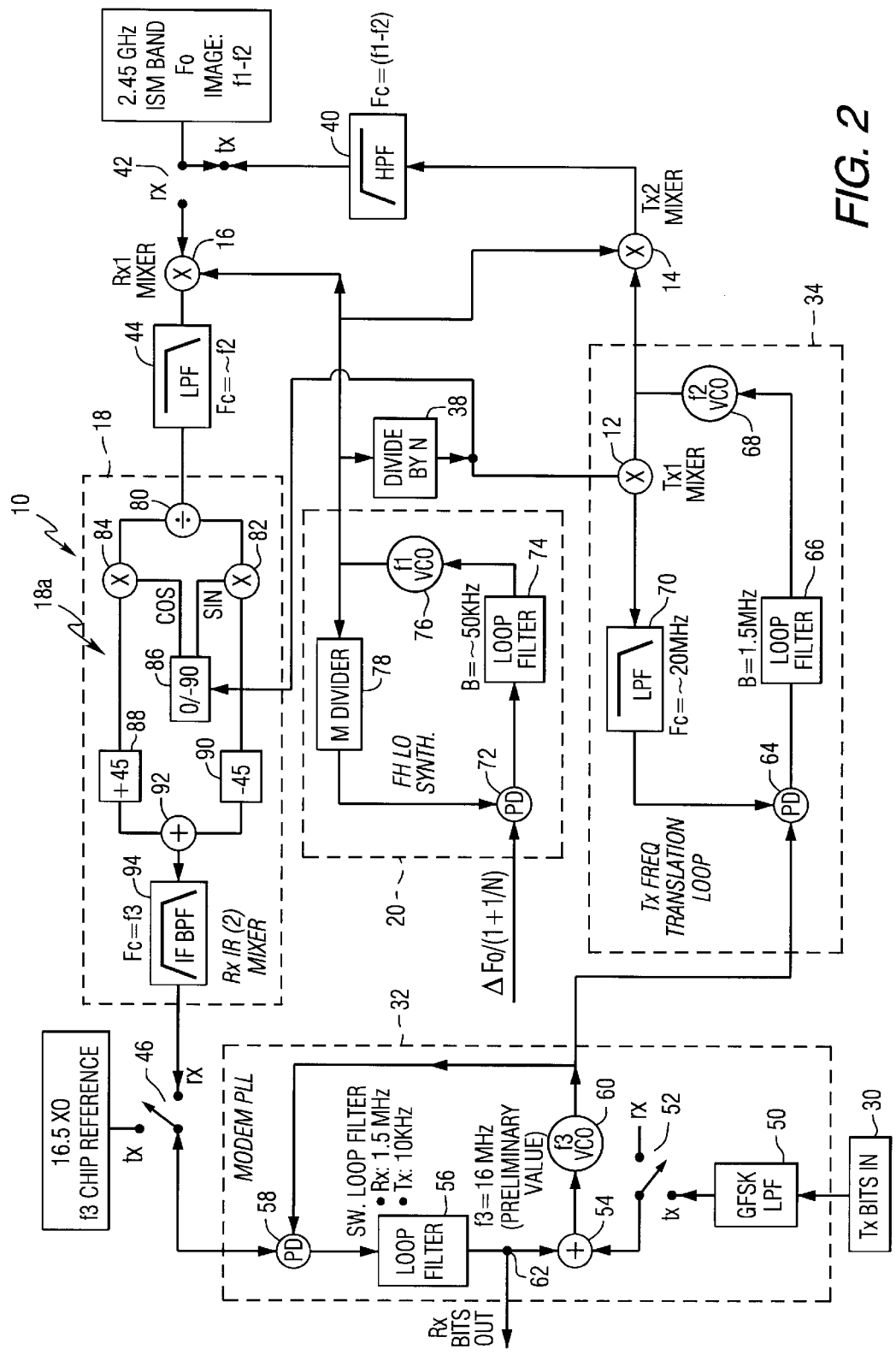
FIG. 2 is a more detailed block diagram of the apparatus shown in FIG. 1.

In the radio frequency processor 10 of the present invention, shown in FIGS. 1 and 2, there is only one oscillator, referred to by the frequency hopping local oscillator synthesizer 20, generating an oscillator signal at frequency f1 to first mixers and into a divider 22 circuit and into the second mixers. A description of the basic components of the invention follows with a brief description of the mathematics operable for the present invention. The transmitter circuits will be first described, followed by the receiver circuits.

Transmit bits are generated via transmitter generator 30 and forwarded into the modulator/demodulator phase locked loop circuit 32. A signal is passed into a transmitter frequency translation loop 34 and then into the first transmit mixer 12. An oscillator signal is generated from the frequency hopping local oscillator synthesizer 20, which has generated its signal through a divide by N circuit 38 into the transmitter frequency translation loop 34 and first transmit mixer 12 to be mixed therein to formulate the first intermediate frequency f2 signal. This signal is mixed at the second transmit mixer 14, which receives the oscillator signal from the frequency hopping local oscillator synthesizer 20 without passing through the divide by N circuit 22. It outputs via high pass filter 40 the ISM band frequency Fo that is an image of the f1–f2. A cut-off frequency Fo exists in the high pass filter 40. The signal then passes into a transmit/receive switch 42 at the desired frequency.

On the receiver circuit side, the modulated radio frequency signal, i.e., a frequency hopping signal in one aspect of the invention, enters the transmit/receive switch 42, which has been switched to the receiver circuit side. The signal enters the first receive mixer 16 that receives the oscillated signal f1 from the frequency hopping local oscillator synthesizer 20. An intermediate frequency f2 signal is output into a low pass filter 44. Within the second receiver image reject mixer circuit 18, having sine/cosine signal wave component quadrature mixing circuits explained below, the second intermediate frequency f3 signal is generated into a transmit/receive switch 46 to pass the signal into the modulator/demodulator phase locked loop 32 where the receive bits pass and are forwarded therefrom.

All components as described, with the exception of the higher frequency, frequency hopping local oscillator synthesizer 20, and can be formed monolithically with the frequency ranges in operation, as will be described.

For purposes of description, selected components of the block components shown in FIG. 1 are now described with reference to the one preferred embodiment of the circuit shown in FIG. 2.

As shown in FIG. 2, the transmit/receive switch 46 allows switching between the transmit reference signal and the second intermediate frequency f3 received from the second receiver mixer 18. The modulator/demodulator phase locked loop 32 includes a GFSK low pass filter 50 that receives the generated transmit bits from the transmitter bit generator 30. These bits pass from the low pass filter 50 through a phase locked loop transmit/receive switch 52 that is in the transmit switch mode. The signal passes into a modem phase lock loop summing circuit 54 that has received the signal from a loop filter and phase detector 58. This loop includes a voltage controlled oscillator 60 that loops back into the phase detector 58. The loop filter 56 has a receiver operability of 1.5 MHz and a transmitter operability of 10 KHz. As described before, the receiver bits are forwarded out at a receiver connection 62 that exists between the loop filter 56 and the modem phase lock loop summer 54.

On the transmitter circuit side, the second intermediate frequency f3 signal passes into the transmitter frequency translation loop 34 and initially enters a phase detector 64 and a loop filter 66, whose bandwidth is about 1.5 MHz, and into a voltage controlled oscillator 68. In one aspect of the present invention, the voltage controlled oscillator 68 is at about 280 MHz. This circuit loop includes the first transmit mixer 12 and a low pass filter 70 where the cut-off frequency fc is about 20 MHz. The first transmit mixer 12 receives the local oscillator signal from the frequency hopping local oscillator synthesizer 20 through the divide by N circuit 38. The generated and upconverted first intermediate frequency 12 signal enters the second transmit mixer that has received the local oscillator signal from the frequency hopping local oscillator synthesizer 20, without having passed through the divide by N circuit 22. The resultant up converted radio frequency signal as the desired modulated radio frequency signal passes into the high pass filter 40 and through the transmit/receive switch 42 when it is switched on in the transmit mode.

The frequency hopping local oscillator synthesizer 20 includes a phase detector 72 that receives a reference signal with a frequency $\Delta F0/(1+1/N)$ and a loop filter 74 where B (bandwidth) is approximately 50 KHz, and an off-chip voltage controlled oscillator 76 of frequency f1, and an M divider 78 circuit in the loop. The M divider is operable with N divider as known to those skilled in the art.

The second receiver image receive mixer circuit includes the quadrature mixing circuit 18a, and includes a signal splitter circuit 80 with respective cosine and sine mixer circuits 82,84 for the quadrature that are operative with a 0/–90° phase circuit 86. Respective cosine and sine mixers feed respective +45 and –45 shifter circuits 88,90 that pass the signal into a summing circuit 92 and into an intermediate frequency bandpass filter 94, having a center frequency Fc equal to f3 and a bandwidth sufficient to pass the modulated signal, which is about 1 MHz in this example.

The off-chip oscillator VCO 76 is embedded in a relatively narrow loop and requires good phase noise. Because of its higher frequency, it is typically formed off-chip. The on-chip VCO 60 would require about 5% accuracy and an RC network off-chip, if necessary. The voltage controlled oscillator 68 is an on-chip oscillator, embedded in the wide phase locked loop, and tolerates poor phase noise because it works in a heterodyne manner and is not a frequency multiplier. It is still frequency modulated, and residual noise would not be amplified. The loop filter 66 drives the VCO 68 through the proper instantaneous frequency and with the loop, an error signal is formed. The actual frequency that is generated from the second transmit mixer 14 is one of 80–100 frequencies that are in the ISM band as desired, as known to those skilled in the art. The frequencies could be stepped within their band, as in 1 MHz steps.

In the receive mode of operation, the signal passing from the low pass filter 44 has a cut-off frequency Fc at the f2 frequency, about 287 MHz. The second receive mixer acts in an image reject down conversion process to down convert the modulated radio signal from 287 MHz down to about 16 MHz.

The various ranges of the frequencies and divide by N number for FIG. 2 can be represented as:

$$Fo=f3+f1*(1+1/N)$$

$$\Delta f1=\Delta Fo/(1+1/N)$$

$$N=(Fo-f2)/(f2-f3)$$

$$f2=(f3+Fo/N)/(1+1/N)$$

$$f1=Fo-f2$$

EXAMPLE (based upon FIG. 3):

$$N=4, Fo=2.45 \text{ GHz}, \Delta Fo=1 \text{ MHz},$$

$$f3=16.0 \text{ MHz}$$

then $$f2=502.8 \text{ MHz}, f1=1.9472 \text{ GHz},$$

$$\Delta f1=800 \text{ kHz (synthesizer reference)}$$

Basic mathematics substantially supporting the embodiment shown in FIGS. 1 and 2 are set forth below.
BTCʋBTC{0, 1 . . . 93} (BTC Blue Tooth Channel)

$$Fo=BTC*1 \text{ MHz}+2.402 \text{ GHz}$$

where Fo is the frequency within "2.402–2.495 band" (A merger of USA and JAPAN RF Channels)
Receiver Tuned Frequency:

$$Fo_{receiver}=f3+f1/N+f1=f1(1+1/N)+f3$$

Transmitter Tuned Frequency:

$$Fo_{transmitter}=f1+f2 \text{ where } f2=f3+f1/N \text{ so } Fo_{transmitter}=f1(1+1/N)+f3$$

Conclusion:

$$Fo_{receiver}=Fo_{transmitter}=Fo$$

The concluding equation means RX and TX are both tuned to same frequency given f1, f3 and N.
Useful Relationships . . .
Synthesizer Step Size (Reference Frequency):

$$dFo=f3+(f1+df1)(1+1/N)-f3-f1(1+1/N)=df1(1+1/N) \text{ hence } df1=dFo/(1+1/N)-\text{step size}$$

Value of f2 given a vlue of N:

$$f2=f3+f1/N=f3+(Fo-f2)/N \rightarrow \text{solving yields } \rightarrow f2=\{N*f3+Fo\}/\{1+N\}$$

Value of N given f2 frequency:

$$N=\{Fo-f2\}/\{f2-f3\}$$

Image Frequency:

$$f1-f2$$

IF frequency:

$$f2$$

Synthesizer frequency selection equations:

$$f1=M*(dFo)/(1+1/N)$$

$$M=2402+3TC-f3 \text{ (units MHz)}$$

The dual conversion synthesizer forming the frequency hopping local oscillator synthesizer maintains a specified radio frequency step side with a divide by N operation. The canonic programmable frequency synthesizer has a reference equal to the output step size, ΔFo. Dual conversion with divide by N changes the reference frequency to ΔFo/(1+1/N). The step size seen by the up conversion in the Tx and down conversion in the Rx, however, is still ΔFo. The basic mathematics to show this fact are:

f1 VCO output: $\Delta Fo/(1+1/N)$ divide by N output: $\Delta Fo/((1+1/N)*N)$

The above frequency steps are summed by dual conversion. The sum of these partial step sizes is shown below:

$$\Delta Fo/(1+1/N)+\Delta Fo/((1+1/N)*N)$$

$$\Delta Fo*N/((1+1/N)*N)+\Delta Fo/((1+1/N)*N)$$

$$(\Delta Fo*N+\Delta Fo)/((1+1/N)*N)$$

$$\Delta Fo*(N+1)/(N+1)$$

$$\Delta Fo$$

The above mathematical steps show dual conversion with divide by N maintains the step size seen by the up and down conversions. Dual conversion can be combined with other operations (e.g., multiply by N).

Figure 3:
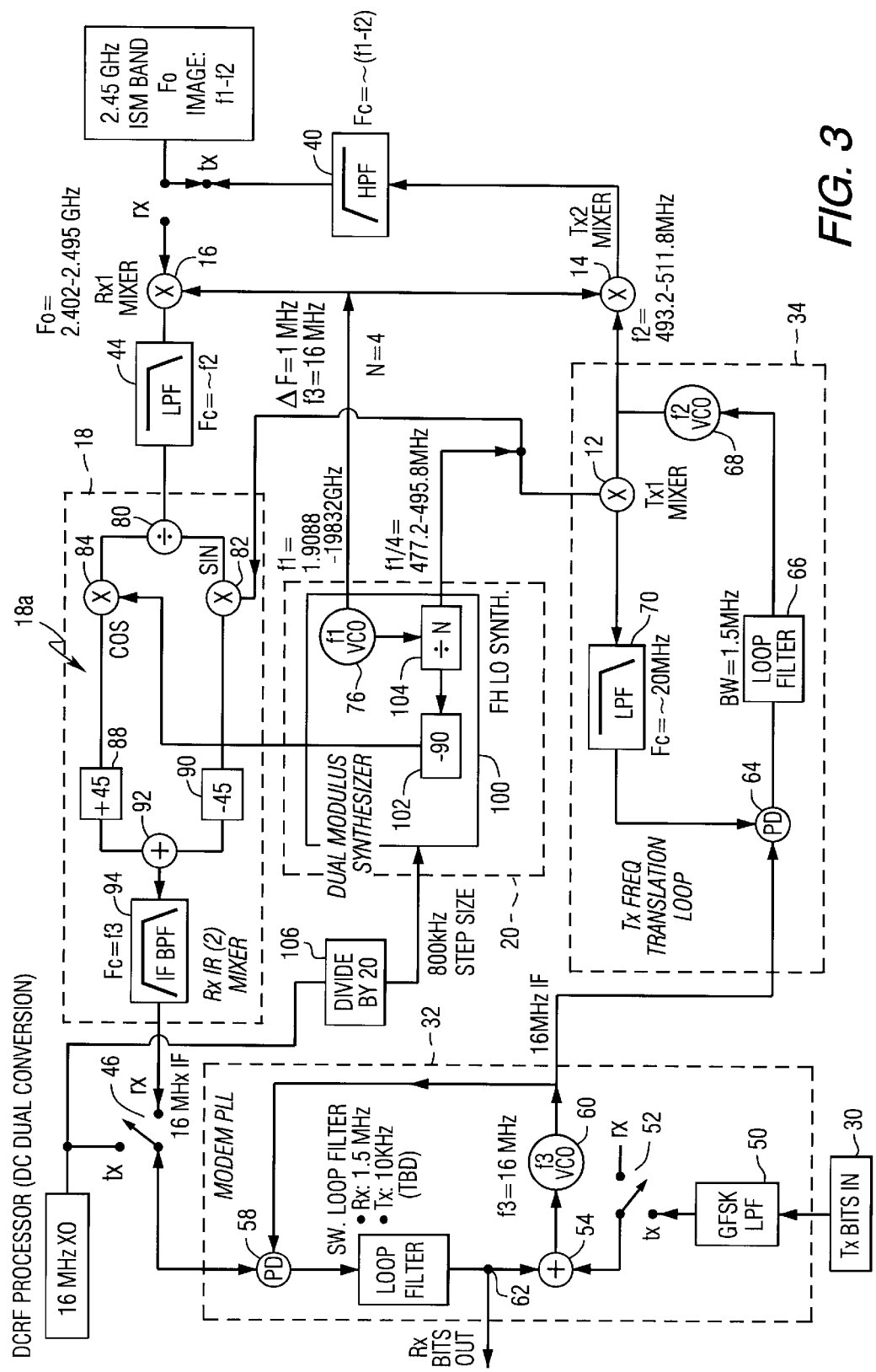
FIG. 3 is another embodiment of the apparatus of FIG. 1 showing a modified frequency hopping local oscillator synthesizer and second receive mixer circuit.

An example is shown in FIG. 3, where similar elements shown in FIGS. 1 and 2 are given the same reference numerals.

The frequency hopping local oscillator synthesizer has a dual modulus synthesizer circuit 100 that includes a −90 phase circuit 102, the f1 VCO 76, and a divide by N circuit 104, which is configured by a divide by 4, or N=4. The dual modulus synthesizer is fed by a transmit reference signal that has been divided via a divide by 20 circuit 106, which allows 800 KHz steps.

The second receiver mixer circuit 18 includes the sine and cosine mixers 82,84 where the cosine mixer 84 receives a signal from the dual modulus synthesizer 100, and more particularly, the +45 and −45 phase circuits 88,90 receive signals from the sine and cosine mixers 82,84 into the summing circuit 92 and then into the bandpass filter 94 as described before. The 16 MHz reference signal is shown as produced by the reference signal generator. Various statistics are shown below for the radio frequency processor circuit shown in FIG. 3.

$$Fo=f3+f1*(1+1/N)$$

$$\Delta F1=\Delta F/(1+1/N)$$

$$N=(Fo-f2)/(f2-f3)$$

$$f2=(f3+Fo/N)/(1+1/N)$$

$$\Delta f1=Fo-f2$$

EXAMPLE
(BTC=48)

$$Fo=2.45 \text{ GHz}, dFo=1 \text{ MHz},$$

f3=16.5 MHz then f2=502.8 MHz, f1=1.9472 GHz, df1=800 kHz (reference)

This application is related to copending patent application entitled, "APPARATUS FOR RADIO FREQUENCY PROCESSING WITH SINGLE OSCILLATOR FOR INTERMEDIATE FREQUENCY PROCESSING," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

What is claimed is:

1. An apparatus for radio frequency processing comprising:

a local oscillator synthesizer circuit having a voltage controlled oscillator that generates an oscillator signal f1, a divide-by-N circuit for receiving the oscillator signal f1 and dividing same to produce an f1/N oscillator signal, and a dual modulus synthesizer connected to said divide-by-N circuit for generating a quadrature modulus signal f1/N;

a receiver circuit operatively connected to the local oscillator synthesizer circuit and having a receive mixer that receives a radio frequency signal and oscillator signal f1, a quadrature function image reject mixing circuit connected to the receive mixer, wherein said quadrature function image reject mixing circuit receives the quadrature modulus signal f1/N and the f1/N oscillator signal for down converting a received radio frequency signal into intermediate frequencies for demodulation;

a transmitter circuit connected to said local oscillator synthesizer circuit and having a heterodyne mixer circuit and a transmit mixer connected to said heterodyne mixer circuit wherein said transmit mixer receives said oscillator signal f1 and said heterodyne mixer circuit receives said f1/4 oscillator signal for up converting first and second intermediate radio frequency signals to a transmit radio frequency signal; and a modulator/demodulator phase locked loop circuit operatively connected to said receiver and transmitter circuits for demodulating signals received from said receiver circuit and modulating signals for processing by said transmitter circuit; and a transmit/receive switch for switching between transmit and receive functions.

2. An apparatus according to claim 1, wherein said quadrature function image reject mixing circuit comprises sine and cosine mixer components, +45 and −45 shifters operatively connected to said sine and cosine mixer components, and a summing circuit that receives signals from said +45 and −45 shifters.

3. An apparatus according to claim 1, wherein said receiver circuit, transmitter circuit and modulator/demodulator phase locked loop are monolithically formed.

4. An apparatus according to claim 1, and further comprising a reference signal generator operatively coupled to the local oscillator synthesizer.

5. An apparatus according to claim 1, wherein said modulator/demodulator phase locked loop circuit comprises a phase detector, voltage controlled oscillator, and a summing circuit operatively coupled to said phase detector and said voltage controlled oscillator.

6. An apparatus according to claim 1, wherein said phase locked loop circuit comprises a transmit/receive switch for switching between a transmit function for receiving transmit data within the summing circuit and a receive function where no transmit data is received.

7. An apparatus according to claim 1, and further comprising a high pass filter operatively connected to said transmit mixer.

8. An apparatus according to claim 1, and further comprising wherein said transmit radio frequency signal comprises an FSK modulated signal.

9. An apparatus for radio frequency processing comprising:

a local oscillator synthesizer circuit having a voltage controlled oscillator that generates an oscillator signal f1, a divide-by-N circuit for receiving the oscillator signal f1 and dividing same to produce an f1/N oscillator signal, and a dual modulus synthesizer connected to said divide-by-N circuit for generating a quadrature modulus signal f1/N, a receiver circuit operatively connected to the local oscillator synthesizer circuit and having mixer circuits that receive a radio frequency signal, the oscillator signal f1, quadrature modulus signal f1/N, and the f1/N oscillator signal for down converting a received radio frequency signal into intermediate frequencies for demodulation;

a transmitter circuit connected to said local oscillator synthesizer circuit and having mixer circuits connected to said local oscillator synthesizer circuit for receiving said oscillator signal f1 and said f1/N oscillator signal and up converting a radio frequency signal of first and second intermediate frequencies into a transmit radio frequency signal;

a modulator/demodulator phase locked loop circuit operatively connected to said receiver and transmitter circuits for demodulating signals received from said receiver circuit and modulating signals for processing by said transmitter circuit;

a transmit/receive switch for switching between transmit and receive functions; and a reference signal generator operatively connected to said local oscillator synthesizer circuit and said modulator/demodulator phase locked loop circuit for generating the same reference signal to said local oscillator synthesizer circuit when in a transmit mode and to said local oscillator synthesizer circuit.

10. An apparatus according to claim 9, wherein said reference signal is about 16 MHz, and said transmit and received radio frequency signal are about 2.4 GHz.

11. An apparatus according to claim 9, wherein said mixer circuits of said receiver circuit comprises a quadrature function image reject mixing circuit having sine and cosine mixer components, +45 and −45 shifters operatively connected to said sine and cosine mixer components, and a summing circuit for receiving signals from said +45 and −45 shifters.

12. An apparatus according to claim 9, wherein said receiver circuit, transmitter circuit and modulator/demodulator phase locked loop are monolithically formed.

13. An apparatus according to claim 9, and further comprising a reference signal generator operatively coupled to the local oscillator synthesizer.

14. An apparatus according to claim 9, wherein said modulator/demodulator phase locked loop circuit comprises a phase detector, voltage controlled oscillator, and a summing circuit operatively coupled to said phase detector and said voltage controlled oscillator.

15. An apparatus according to claim 9, wherein said phase locked loop circuit comprises a transmit/receive switch for switching between a transmit function for receiving transmit data within the summing circuit and a receive function where no transmit data is received.

16. An apparatus according to claim 9, and further comprising a high pass filter operatively connected to said transmit mixer.

17. An apparatus according to claim 9, and further comprising wherein said transmit radio frequency signal comprises an FSK modulated signal.

* * * * *